United States Patent [19]
Lüchinger et al.

[11] Patent Number: 6,056,184
[45] Date of Patent: May 2, 2000

[54] APPARATUS FOR SHAPING LIQUID PORTIONS OF SOLDER IN SOFT SOLDERING SEMICONDUCTOR CHIPS

[75] Inventors: Christoph B. Lüchinger, Cham; Michael Lothenbach, Baar; Guido Suter, Steinhausen, all of Switzerland

[73] Assignee: ESEC SA, Cham, Switzerland

[21] Appl. No.: 08/996,654

[22] Filed: Dec. 23, 1997

[30] Foreign Application Priority Data

Jan. 8, 1997 [CH] Switzerland ............... 0027/96

[51] Int. Cl.[7] ............... B23K 1/00; B23K 37/00; B23K 3/02
[52] U.S. Cl. ............... 228/33; 228/5.1; 228/15.1; 228/55
[58] Field of Search ............... 228/33, 55, 215, 228/256, 5.1, 15.1

[56] References Cited

U.S. PATENT DOCUMENTS

| | | |
|---|---|---|
| 1,561,924 | 11/1925 | Henry . |
| 3,539,160 | 11/1970 | Henes . |
| 3,700,156 | 10/1972 | Hermanns ............... 228/6.2 |
| 3,938,722 | 2/1976 | Kelly et al. ............... 228/1.1 |
| 4,166,562 | 9/1979 | Keizer et al. ............... 228/5.1 |
| 4,585,157 | 4/1986 | Belcher ............... 228/180.21 |
| 4,600,228 | 7/1986 | Tarbuck ............... 294/64.1 |
| 4,634,043 | 1/1987 | Avedissian . |
| 4,803,124 | 2/1989 | Kunz . |
| 5,185,509 | 2/1993 | Todd et al. ............... 219/85.16 |
| 5,190,205 | 3/1993 | Ozawa et al. ............... 228/44.7 |
| 5,576,492 | 11/1996 | Phalin ............... 73/634 |
| 5,614,118 | 3/1997 | Weber ............... 219/243 |

OTHER PUBLICATIONS

XP002035203 (in IBM Technical Disclosure Bulletin, vol. 19, No. 9, dated Feb. 1997 by R. G. Christensen & F. P. Koverda).

*Primary Examiner*—Patrick Ryan
*Assistant Examiner*—Kiley Stoner
*Attorney, Agent, or Firm*—McCormick, Paulding & Huber LLP

[57] ABSTRACT

The apparatus, in preparation of soft soldering semiconductor chips to a substrate (6), is for the shaping of spherically domed liquid portions of solder (8) into flat solder applications (8"), as evenly distributed as possible and correctly positioned on the substrate. On a shaft (10) which can be lifted and lowered, a punch (20) with a punch surface (22) is guided vertically, spring mounted and slewable all around the axis of motion (16) and also frictionally engaged. The punch (20) is provided with distance keeping means—e.g. in the form of a circumferential rim (24)—which extends beyond the punch surface (22) and is intended for touching down on the substrate (6). In each operation cycle the punch (20) is automatically aligned to the substrate (6). Since the punch (20) is self-adjusting with respect to the shaft (10), it is unnecessary to maintain an exactly defined height position above the substrate.

11 Claims, 2 Drawing Sheets

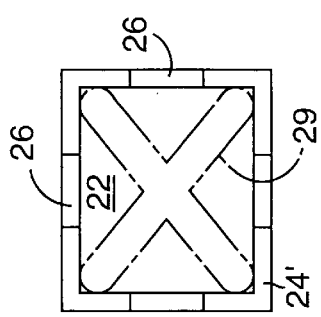
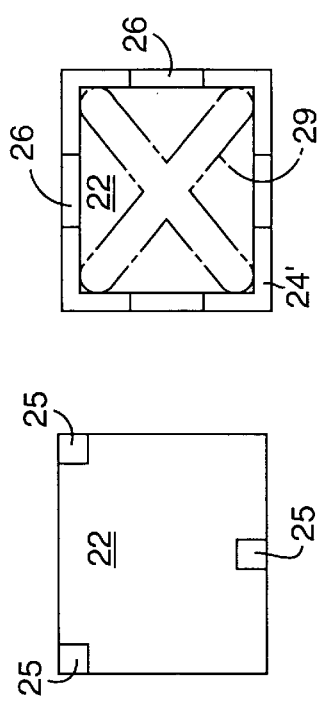
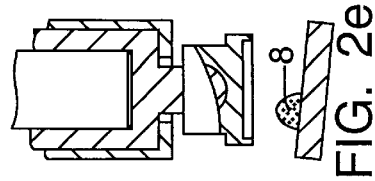
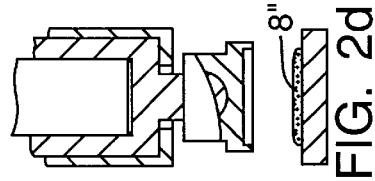
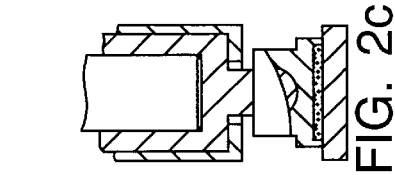
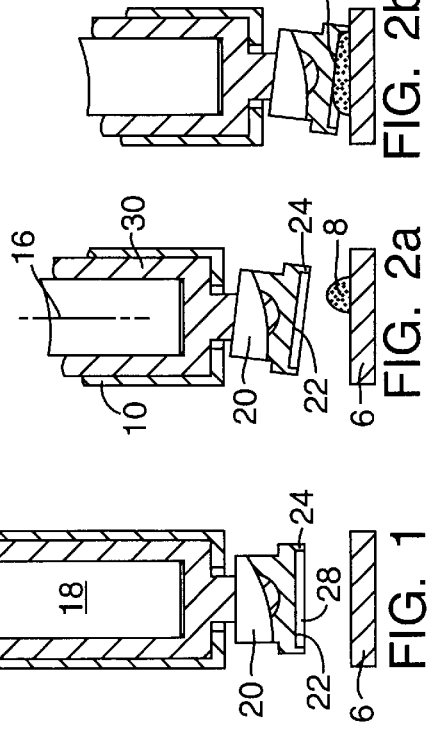
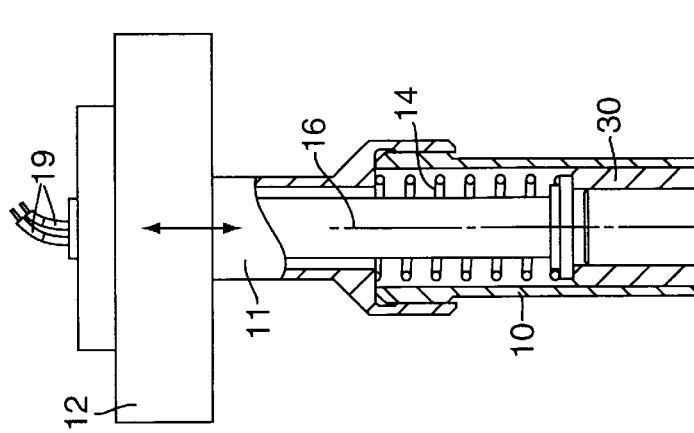

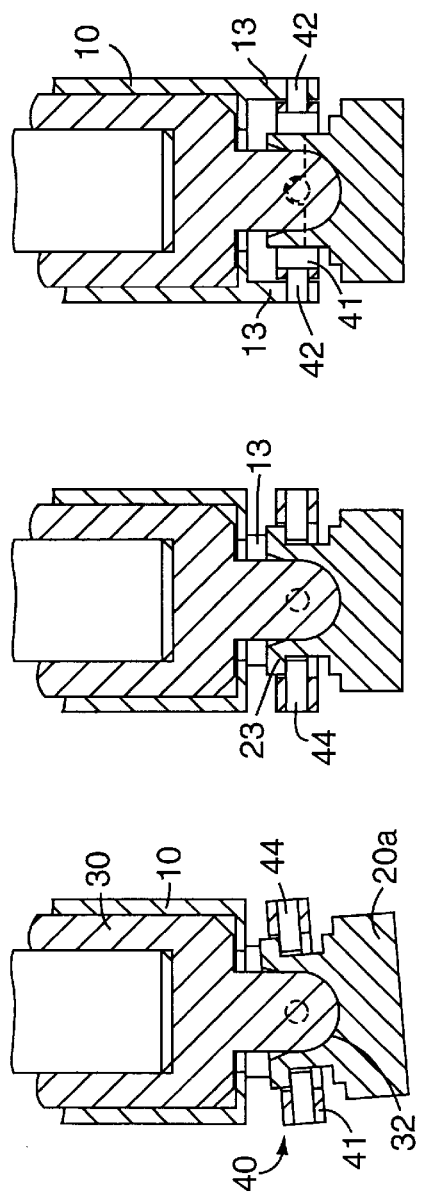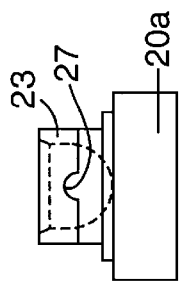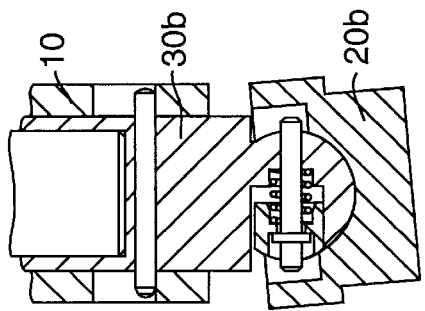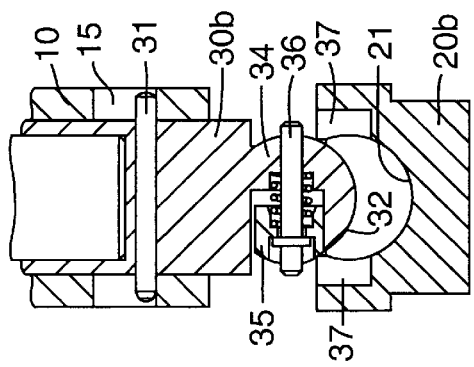

APPARATUS FOR SHAPING LIQUID PORTIONS OF SOLDER IN SOFT SOLDERING SEMICONDUCTOR CHIPS

BACKGROUND OF THE INVENTION

When fixing semiconductor chips to a substrate by soft soldering, the required portion of solder has to be placed on the substrate before positioning the chip. A method often used for this purpose is the touching with one end of the soldering wire, of the respective spot of the substrate—typically a lead frame made of copper alloy—with the substrate heated to a temperature above the melting point of the solder, thus melting a piece of the wire. Another known process is the placing of discrete, solid solder portions on the heated substrate. In both cases, the liquid solder portions develop are more or less dome-shaped, with shape and position of the drop of molten solder depending very much on the local wetting characteristics of the substrate's surface, among other factors.

For faultless soldering of the chip placed on the substrate later, however, a flat solder layer distributed under the entire chip surface and of a thickness as even as possible is required. The dome shape mentioned and possible lateral deviations in the positioning of the individual drops make it difficult, however, to meet all these requirements reliably and with sufficient accuracy. It also has to be taken into account that the assembly of chips is performed at a high rate, which means that the chips are in general placed at high speed on the substrate, i.e. on the liquid solder.

PRIOR ART

Various devices have therefore been proposed to modify the shape of the solder drop into a thin, spread-out solder layer before positioning the chip. One known apparatus of this kind consists basically of a shaft which can be lifted or lowered with respect to the substrate, and a punch connected to it with the punching surface below, facing the substrate. With this apparatus the desired effect in many respects can only be obtained unsatisfactorily. A first disadvantage is that the stamp or punch has to be lowered to a predetermined, very low distance above the substrate, which requires a correspondingly precise mechanism and an appropriate low end speed. Deviations in thickness and position of the substrate as well as possibly varying slanted positions of the substrate cannot be taken into account and will therefore have a direct effect on the thickness and a strong influence on the lateral distribution of the solder. Even minimal deviations in the angle between the punch surface and the surface of the substrate may lead to considerable lateral displacement of the solder spots. In addition, by flattening the solder drops by means of such an apparatus the resulting solder spot will be more or less rounded and will not conforming to the rectangular or square shape of the chips.

SUMMARY OF THE INVENTION

A principal object of the present invention is to overcome the aforesaid disadvantages and to create a practice oriented device for the preliminary shaping of liquid solder portions. In particular, the required shape and position of the formed solder portions should be maintained regardless of the varying process parameters and the characteristics of the materials used.

The present invention is based on an apparatus similar to the one described above. In order to achieve the above-mentioned and other objects, the apparatus according to the invention is characterized in that said punch is spring mounted and guided vertically along said shaft, slewable in all directions with respect to the axis of motion of said shaft, as well as frictionally engaged, and in that distance keeping means are provided at said punch, protruding beyond said lower surface of the punch and adapted to touch down onto said substrate.

Due to the design of the apparatus corresponding to the invention, it is no longer necessary to observe a predefined precise height or distance of the punch surface from the substrate when lowering the shaft. Instead the stroke of the shaft will merely have to be adjusted so as to ensure that the distance keeping means will touch down safely on the substrate. Thanks to the distance keeping means and the spring mounting of the punch with respect to the shaft, as well as to the all around slewability of the punch, there will always be an exact distance between the punch surface and the substrate's surface with the punch surface placed approximately parallel to the substrate's surface, regardless of any deviations in the thickness or position of the substrate etc. Due to the frictionally engaged bearing of the punch, its respective alignment will be maintained when it is lifted off the substrate, with, an automatic re-adjustment of the punch occurring when it is placed down again. Because of the self-adjustment of the punch the expenditure for setting up the machine for a new product will be considerably reduced. In addition the setting up is less dependent on the skills of the personnel.

A further advantage is that due to the orientation of the punch surface parallel to the substrate, lateral deviations in the position of the applied solder-drop will have less effect on the variation of the gravity center of the resulting flat dispersion of the solder. In particular, according to a preferred embodiment of the invention, the distance keeping means may be shaped as circumferential protruding rim around the punch surface. Such a rim will actively limit and center the solder mass during its spreading over the substrate. Depending on the layout of this rim, a (low) hollow space for the solder is defined, with the space's lateral extension adapted to the format of the chips to be soldered.

On the whole, the invention allows the preliminary forming of solder portions within short cycle periods, wherein the solder portions are adapted to the requirements of the subsequent chip assembly. The solder portions are reliably formed under varying process conditions.

BRIEF DESCRIPTION OF THE DRAWINGS

The present invention is described in greater detail below by reference to various typical embodiments and the following drawings:

FIG. 1 is a simplified general representation, in a vertical section, of an apparatus according to the invention;

FIG. 2 shows the lower part of the apparatus of FIG. 1 in relation to the substrate and the solder, in several stages a to e of a cycle of operation;

FIGS. 3 to 5 in an analog presentation with FIG. 5 showing a side view of FIG. 4 around the vertical axis by 90° as compared to FIGS. 3 and 4;

FIG. 6 shows the punch inits position according to FIG. 5 in a side view;

FIGS. 7 and 8 show another embodiment of the apparatus, in this case for a snap-on mounting of the punch to a spherical head, in FIG. 7 released and in FIG. 8 in snapped-on position;

FIGS. 9, 10 and 11 are views of the surface of a punch with different examples of distance keeping means.

DETAILED DESCRIPTION OF THE PREFERRED EMBODIMENTS

It should be mentioned here that in the drawings the height of the distance keeping means (FIGS. 1, 2) as well as the lateral tilt or inclination of the punch (FIGS. 2a, 2b, 3, 8) or of the substrate (FIG. 2e) are strongly exaggerated for better understanding. In reality the distance between punch surface and substrate (corresponding to the thickness of the solder layer required) will be only a few hundredth of a millimeter, and the angular deviations will be a few degrees or perhaps only a fraction of a degree. Therefore, the distance keeping means are not shown, i.e. they cannot be seen in the sections of FIGS. 3, 4, 5, 7, and 8.

The apparatus according to FIG. 1 comprises a vertical shaft consisting of a jacket 10 and a supporting tube. The jacket 10 has a screw connection to the supporting tube 11 at the top. A flange 12 connected to the supporting tube 11 is provided for connecting the apparatus to a drive mechanism (not shown) of an automatic chip assembly machine. As indicated by the vertical arrows, the shaft—and the entire apparatus with it—can thus be lifted and lowered. Under the apparatus there is a substrate 6, typically a lead frame strip, movable in steps horizontally, i.e. transversely to the plane of the drawing sheet. At a place in front of the apparatus (with reference to the direction of motion of the substrate), discrete soft solder portions 8 (FIG. 2a) are dispensed onto the heated substrate 6. The liquid solder portions are then formed by means of the apparatus, and then at a place behind the apparatus a chip is placed on the prepared solder dispersion and thus soldered to the substrate. These process steps are generally known in semiconductor assembly technology and therefore not described in detail here.

Part of the apparatus according to FIG. 1 is a punch 20 with a lower surface 22 directed at the substrate 6. The punch 20 is held by a supporting part 30 and is slewable in all directions with respect to the vertical axis of motion 16 of the shaft; it is also frictionally engaged and conveniently replaceable, as will be described in some examples below. The supporting part 30 is slidingly guided vertically in the jacket 10 of the shaft; a relative upward displacement is achieved against the force of a pressure spring 14 braced between the supporting part 30 and the supporting tube 11 of the shaft.

The punch 20 and the supporting part 30 are mutually engaged by a spherical surface 32. In the supporting part, an electric heating cartridge 18 (with supply cables 19) is preferably installed, from which the punch 20 is heated via the spherical surface 32.

The punch 20 is provided with distance keeping means protruding from the punch surface 22 downward and is intended to touch down on the substrate 6 when the apparatus is in a lowered position. As an example, in FIGS. 1 and 2 Circumferential rim is shown protruding from the punch surface, defining and laterally limiting a hollow space 28 under the punch. With respect to possible variations of the distance keeping means, reference is made to FIGS. 9 to 11 and the description below.

In FIG. 2 the functioning of the apparatus is illustrated in different stages a to a. In the initial stage a of the operating cycle the apparatus is in an upper position, and a liquid, dome-shaped solder portion 8 is located under the punch 20 on the substrate. Because of inaccurate positioning of the solder portion it may be dislocated as shown with respect to the vertical axis 16. It is furthermore assumed that the punch, i.e. the punch surface, is in a slanted position relative to the substrate (e.g. as a consequence of a preceding positioning on an inclined substrate); due to the frictionally engaged bearing of the punch it will maintain its position for the time being.

The apparatus is now lowered towards the substrate. In FIG. 2b the moment is shown in which one edge of the rim 24 (assumed of rectangular shape) touches the substrate. The liquid solder portion 8' is partially flattened already and dispersed within the space 28. The lower end position of the apparatus is shown in FIG. 2c. The rim 24 of the punch is now completely resting on the substrate. By setting a small 'overstroke' of the shaft (which would also compensate for possible variations in thickness of the substrate), the supporting part 30 will be slightly lifted with respect to the jacket 10, thereby making sure that the punch is securely positioned flush with the substrate. The punch has thus been automatically adjusted to the surface of the substrate, and the punch surface 22 is now parallel to it. Then the apparatus is lifted again (FIG. 2d). On the substrate there remains the formed solder portion 8" in the desired position (centered with respect to axis 16). Due to the alignment of the punch and corresponding to the height of rim 24, the solder distribution shows a practically uniform thickness over the entire surface, with only a slight increase at the center due to the surface tension of the liquid solder. In the case shown (circumferential rim 24) the shape of the surface is also defined, i.e. adapted to the format of the chip to be soldered. This of course presupposes that the solder portions 8 are dosed so that their volume corresponds to that of the hollow space 28.

In addition it is presupposed that the punch will not be wetted by the liquid solder. Suitable materials for the punch, or at least the lower part including the punch surface 22, are in particular graphite or steel.

Now a new operating cycle may be started. As long as the position of the substrate surface is not changed in the subsequent cycles, the punch will keep its position with respect to axis 16, i.e. there will be no angular adjustments during lowering onto the substrate. Should an inclined or "tilt " position of the substrate (FIG. 2e) occur, however, the punch will immediately and automatically adjust itself correspondingly.

In the following, some particular embodiments of a slewable and replaceable mounting of the punch are described. For example, according to FIGS. 3 to 6 a gimbals arrangement with the global designation 40 (FIG. 3) has been provided for this purpose. The gimbal 41 arranged concentrically to the spherical surface 32 is supported by means of two axle bolts 42 on two tabs 13 extending from the jacket 10 (FIG. 5). On the gimbal diameter, dislocated with respect to the bolts 42 by 90°, there are two other axle bolts 44 fixed tightly to gimbal 41. These form the support for two lateral shoulders 23 of the punch 20a, each with a centered cavity 27 on its underside.

With the gimbal bearing shown, punch 20a is slewable or tiltable in any direction. There is a frictional engagement to the spherical surface 32, with part 30 being biased downwards by the compressed spring 14 (FIG. 1); thus any bearing play is also eliminated. By this gimbal arrangement the punch 20a is also secured against rotation with respect to the jacket 10. The punch is easily replaceable by being lifted and then turned by 90° in order to disengage the shoulders 23 from the bolts 44.

Another example of releasably mounting the punch is shown in FIGS. 7 and 8, displaying a kind of snap-on or 'press stud' fastening of the punch 20b. At the lower end of supporting part 30b there is a spherical head 34, a part 35 of which is radially movable. Part 35 is guided along a fixed pin 36 and biased by a pressure spring arranged around the fixed pin. The spherical head 34 is flattened on both sides parallel to the plane of the drawing (as is not visible on the drawing). The punch 20*b* has a spherical cavity 21 open at the top which will surround the spherical head when the punch is mounted. As can be seen, the punch 20*b* can easily be withdrawn from the spherical head or be attached to it respectively, whereby it is kept slewable in all directions. By the two ends of the fixed pin 36 extending into a slot 37 of the punch, the latter is secured against turning on the spherical head. An interlocking of the supporting part 30*b* with respect to the jacket 10 is provided by a supporting pin 31 fixed in the supporting part 30*b*, the ends of which are slidably mounted in vertical slots 15 of the jacket. The lower ends of the slots 15 also determine the bottom end position of the supporting part 30*b* (under pressure of the pressure spring 14).

In the following, some additional versions of distance keeping means are described in connection with FIGS. 9 to 11. FIG. 9 shows the example already described above, with a circumferential, e.g. rectangular rim 24 protruding from the punch surface 22. As explained, this rim determines the volume of the enclosed hollow space 28 as well as the shape and height of the resulting solder dispersion.

The keeping of a distance between the punch surface 22 and the substrate according to FIG. 10 can be obtained in principle by means of (at least) three separate elevations 25 protruding from the punch surface in suitable places; this version may be applied if a precisely defined shape or format of the solder dispersion is less imperative.

FIG. 11 shows an alternative to the version of the distance keeping means according to FIG. 9. Here the rim 24' is reduced in height in individual places 26, i.e. in these places there will be less distance to the substrate surface. Thereby a kind of venting of the hollow space 28 is obtained when lowering the punch, which may be favorable to a fast spreading of the solder towards rim 24'. There are more options to obtain such venting, e.g. the position and size of the reduced places 26 may be varied, or small slots may be provided in rim 24, extending over the entire height of the rim.

As showing in FIG. 11 the option to provide cavities 29, or structures in general such as trangular wedges in the punch surface 22 is indicated with dash-dotted lines, thus influencing the lateral dispersion or spreading of the liquid solder on the substrate, for example in order to assist the flowing of the solder into the corners of the rim.

We claim:

1. Apparatus for forming liquid solder portions in preparation for soft soldering semiconductor chips to a substrate, the apparatus comprising a shaft which can be lifted and lowered with respect to the substrate, and a punch connected to said shaft and provided with a lower surface directed at the substrate, characterized in that said punch is spring mounted and guided vertically along said shaft, tiltable in all directions with respect to the axis of motion of said shaft, as well as frictionally engaged, and in that distance keeping means is provided on said punch, and protrude beyond said lower surface of the punch to touch down on said substrate.

2. Apparatus according to claim 1, wherein said punch is replaceably mounted on a supporting part, which in turn slides vertically along said shaft against the force of a prestressed spring.

3. Apparatus according to claim 2, wherein said punch and said supporting part are mutually engaged by means at a spherical surface.

4. Apparatus according to claim 3, wherein said punch is provided with a spherical cavity receiving a spherical head on said supporting part, with a part of the spherical head being resilient for fastening to the punch.

5. Apparatus according to claim 3, wherein said punch is attached to said supporting part by means of a gimbal arrangement.

6. Apparatus according to claim 3, wherein heating means are provided at the supporting part for heating of said punch via said spherical surface.

7. Apparatus according to claim 1, wherein said distance keeping means is formed by a rim extending from said punch surface and forming a hollow space for the solder portion.

8. Apparatus according to claim 7, wherein said rim has a projections in places or is provided with slots.

9. Apparatus according to claim 1, wherein said distance keeping means is formed by at least three protrusions extending from a boundary of said punch surface.

10. Apparatus according to claim 1, wherein said punch surface is provided with cavities.

11. Apparatus for forming liquid solder portions in preparation for soft soldering semiconductor chips to a substrate, the apparatus comprising a shaft which can be lifted and lowered with respect to the substrate, and a punch connected to said shaft and provided with a lower surface directed at the substrate, characterized in that said punch is spring mounted and guided vertically along said shaft, tiltable in all directions with respect to the axis of motion of said shaft, and in that distance keeping means is provided on said punch, and protrudes beyond said lower surface of the punch to touch down on said substrate, and said punch is frictionally engaged for maintaining position relative to the shaft when raised from said substrate.

* * * * *

UNITED STATES PATENT AND TRADEMARK OFFICE
CERTIFICATE OF CORRECTION

PATENT NO. : 6,056,184
DATED : May 2, 2000
INVENTOR(S) : Christoph B. Lüchinger et al.

It is certified that error appears in the above-identified patent and that said Letters Patent is hereby corrected as shown below:

In the Abstract:

Item [57],
Line 2, please delete "(6)";
Line 3, please delete "(8)";
Line 4, please delete "(8)";
Line 5, please delete "(10)";
Line 6, please delete "(20)" and delete "(22)";
Line 8, please delete "(16)";
Line 9, please delete "(20)";
Line 10, please delete "(24)";
Line 11, please delete "(22)";
Line 12, please delete "(6)";
Line 13, please delete "(20)" and delete "(6)"; and
Line 14, please delete "(20)" and delete "(10)".

In the Specification:

Column 1,
Line 16, please delete "develop" and insert -- developing --.
Line 54, please delete "conforming" and insert -- conform --.

Column 2,
Line 27, after "addition" please insert --,--.
Lines 57-59, please delete "in an analog presentation with FIG. 5 showing a side view of FIG. 4 around the vertical axis by 90° as compared to FIGS. 3 and 4;" and insert -- show an example of a slewable bearing of a punch, with Fig. 5 showing a side view of Fig. 4 --.
Lines 60-61, please delete "shows the punch in its position according to fig. 5 in a side view;" and insert -- shows a side view of the punch in Fig. 5; --.
Lines 66-67, please delete "are views of the surface of a punch with different examples of distance keeping means." and insert -- are views from below of a

UNITED STATES PATENT AND TRADEMARK OFFICE
CERTIFICATE OF CORRECTION

PATENT NO.    : 6,056,184
DATED         : May 2, 2000
INVENTOR(S)   : Christoph B. Lüchinger et al.

It is certified that error appears in the above-identified patent and that said Letters Patent is hereby corrected as shown below:

punch with different examples of distance keeping means. --.

Column 3,
Line 54, after "2" please insert -- a -- and please delete "Circumferential" and insert -- circumferential --.
Line 60, please delete "a" (second occurrence) and insert -- e --.

Column 4,
Line 44, please delete "gimbals" and insert -- gimbal --.

In the Claims:

Claim 3,
Line 2, please delete "by means".

Claim 8,
Line 2, please delete "a".

Signed and Sealed this

Third Day of July, 2001

Attest:

NICHOLAS P. GODICI
Attesting Officer    Acting Director of the United States Patent and Trademark Office